US008859929B2

(12) United States Patent
Roca I Cabarrocas et al.

(10) Patent No.: US 8,859,929 B2
(45) Date of Patent: Oct. 14, 2014

(54) METHOD AND APPARATUS FOR FORMING A FILM BY DEPOSITION FROM A PLASMA

(75) Inventors: Pere Roca I Cabarrocas, Villebon sur Yvette (FR); Pavel Bulkin, Villebon sur Yvette (FR); Dmitri Daineka, Palaiseau (FR); Patrick Leempoel, Brussels (BE); Pierre Descamps, Rixensart (BE); Thibault Kervyn De Meerendre, Brussels (BE)

(73) Assignees: Dow Corning Corporation, Midland, MI (US); Ecole Polytechnique, Palaiseau (FR)

( * ) Notice: Subject to any disclaimer, the term of this patent is extended or adjusted under 35 U.S.C. 154(b) by 1082 days.

(21) Appl. No.: 12/447,807

(22) PCT Filed: Oct. 26, 2007

(86) PCT No.: PCT/EP2007/009303
§ 371 (c)(1),
(2), (4) Date: Jul. 29, 2009

(87) PCT Pub. No.: WO2008/052703
PCT Pub. Date: May 8, 2008

(65) Prior Publication Data
US 2010/0105195 A1    Apr. 29, 2010

(30) Foreign Application Priority Data
Nov. 2, 2006  (EP) .................................... 06301115

(51) Int. Cl.
*H01L 21/00* (2006.01)
*H01J 37/32* (2006.01)
*H05H 1/46* (2006.01)

(52) U.S. Cl.
CPC ..... *H01J 37/32678* (2013.01); *H01J 37/32192* (2013.01); *H05H 1/46* (2013.01)
USPC ................................................... 219/121.43

(58) Field of Classification Search
CPC ... H01L 21/205; C23C 16/54; H01J 37/32192

USPC .................... 438/485; 118/719, 723 MP; 257/E21.101
See application file for complete search history.

(56) References Cited

U.S. PATENT DOCUMENTS 5,133,826 A * 7/1992 Dandl ...................... 156/345.42
5,180,948 A * 1/1993 Heinemann et al. ...... 315/111.21
(Continued)

FOREIGN PATENT DOCUMENTS

EP        0233613        8/1987
EP        0487114        5/1992
(Continued)

OTHER PUBLICATIONS

Daineka, D., et al., "High Density Plasma Enhanced Chemical Vapor Deposition of Thin Films.", European Physical Journal—Applied Physics, vol. 26, No. 1, Apr. 2004, pp. 3-9, XP002462386.
(Continued)

*Primary Examiner* — Fernando L Toledo
*Assistant Examiner* — Neil Prasad
(74) *Attorney, Agent, or Firm* — Leason Ellis LLP

(57) ABSTRACT

An apparatus is described for depositing a film on a substrate from a plasma. The apparatus comprises an enclosure, a plurality of plasma generator elements disposed within the enclosure, and means, also within the enclosure, for supporting the substrate. Each plasma generator element comprises a microwave antenna having an end from which microwaves are emitted, a magnet disposed in the region of the said antenna end and defining therewith an electron cyclotron resonance region in which a plasma can be generated, and a gas entry element having an outlet for a film precursor gas or a plasma gas. The outlet is arranged to direct gas towards a film deposition area situated beyond the magnet, as considered from the microwave antenna, the outlet being located in, or above, the hot electron confinement envelope.

13 Claims, 11 Drawing Sheets

(56) References Cited

U.S. PATENT DOCUMENTS

| | | | |
|---|---|---|---|
| 5,279,866 A * | 1/1994 | Bourget et al. | 427/575 |
| 5,429,685 A | 7/1995 | Saito et al. | |
| 5,536,914 A | 7/1996 | Pelletier et al. | |
| 5,637,150 A * | 6/1997 | Wartski et al. | 118/723 AN |
| 5,666,023 A | 9/1997 | Pelletier et al. | |
| 6,163,006 A * | 12/2000 | Doughty et al. | 219/121.43 |
| 6,407,359 B1 | 6/2002 | Lagarde et al. | |
| 2002/0022349 A1 | 2/2002 | Sugiyama et al. | |
| 2002/0130032 A1 * | 9/2002 | Ahn et al. | 204/192.12 |
| 2003/0194508 A1 | 10/2003 | Carpenter et al. | |
| 2004/0247948 A1 | 12/2004 | Behle et al. | |

FOREIGN PATENT DOCUMENTS

| | | |
|---|---|---|
| EP | 1075168 | 2/2001 |
| GB | 2083701 | 3/1982 |
| JP | 05314918 | 11/1993 |
| JP | 10081968 | 3/1998 |
| WO | WO-2008/052704 | 5/2008 |
| WO | WO-2008/052705 | 5/2008 |
| WO | WO-2008/052706 | 5/2008 |
| WO | WO-2008/052707 | 5/2008 |
| WO | WO-2008/052708 | 5/2008 |
| WO | WO-2008/053271 | 5/2008 |

OTHER PUBLICATIONS

"Compact Microwave Plasma Source", IBM Technical Disclosure Bulletin, IBM Corp. New York, US, vol. 35, No. 5, Oct. 1, 1992, pp. 307-308, XP000312985.

Bulkin, P., et al, "Plasma enhanced chemical vapour deposition of silica thin films in an integrated distributed electron cyclotron resonance reactor.", Peparation and Characterization, Elsevier Sequoia, NL, vol. 308-309, Oct. 31, 1997, pp. 63-67, XP004524338.

Jes Asmussenjr et al, "The Design and Application of Electron Cyclotron Resonance Discharges.", IEEE Transactions on Plasma Science, IEEE Service Center, Piscataway, NJ, US, vol. 25, No. 6, Dec. 1997, XP011044935.

Daineka, D., et al., "Control and Monitoring of Optical Thin Films Deposition in a Matrix Distributed Electron Cyclotron Resonance Reactor," European Physical Journal, Applied Physics EDP Sciences France, vol. 28, No. 3, Dec. 2004, pp. 343-346.

Bechu S et al: "Multi-dipolar plasmas for plasma-based ion implantation and deposition" Surface & Coatings Technology Elsevier Switzerland, vol. 186, No. 1-2, Aug. 2, 2004, pp. 170-176, XP0024261912 ISSN: 0257-8972.

Bardos L et al: "Microwave Surfatron Systems for Plasma Processing" Journal of Vacuum Science and Technology: Part A, AVS/AIP, Melville, NY, US, vol. 14, No. 2, Mar. 1, 1996, pp. 474-477, X000620528 ISSN: 0734-2101.

Sakudo N et al: "Development of hybrid pulse plasma coating system" Surface and Coatings Technology Elsevier Switzerland, vol. 136, No. 1-3, Feb. 2, 2001, pp. 23-27, XP002427492 ISSN: 02578972.

Awazu K et al: "Films formed by hybrid pulse plasma coating (HPPC) system" AIP Conference Proceedings AIP USA, No. 576, 2001, pp. 955-598, XP002427493 ISSN: 094-243X.

Bulkin P et al: "Deposition of silicon alloys in an integrated distributed electron cyclotron resonance reactor: Oxide, nitride, oxinitrides, and multilayer structures" Journal of Vacuum Science and Technology A.Vacuum, Surfaces and Films, American Institute of Physics, New York, NY, US, vol. 20, No. 2, Mar. 2002, pp. 338-343, PX012005960 ISSN: 0734-2101.

Girard G et al, "Matrix-distributed ECR-PECVD for high-rate deposition of silica for applications in integrated optics" Proceedings of the SPIE—The International Society for Optical Engineering SPIE—Int. Soc. Opt. Eng USA, vol. 4944, 2003, pp. 62-71, PX002436134 ISSN: 0277-786X.

Shing Y H et al: "Electron Cyclotron Resonance Microwave Plasma Deposition of A-Si:H and ASIC: H Films" Solar Cells, Elsevier Sequoia SA, Lausanne, CH, vol. 30, No. 1/4, May 1, 1991, pp. 391-401, XP000243420.

Plais F et al: "Low Temperature Deposition of SiO2 by Distributed Electron Cyclotron Resonance Plasma-Enhanced Chemical Vapor Deposition" Journal of the Electrochemical Society, Electrochemical Society, Manchester, New Hampshire, US, vol. 139, No. 5, May 1, 1992, pp. 1489-1495, XP000355387ISSN: 0013-4651.

Lagarde, T, et al., "Determination of the EEDF by Langmuir Probe diagnostic in a plasma excited at ECR above a multipolar magnetic field", Plasma Sources Sci. Technol. 10, 181-190, 2001.

Moisan & Pelletier, "Microwave Excited Plasmas," Elsevier, 1992, Appendix 9.1 pp. 269-271.

Fontcuberta, A., et al., "Structure and hydrogen content of polymorphous silicon thin films studied by spectroscopic ellipsometry and nuclear measurements" Physical Review B 69,125307/1-10, 2004.

Rafat, N. et al., "The limiting efficiency of band gap graded solar cells" Solar Energy Materials & Solar Cells, 55(1998) 341-361.

Foelsch, J., et al., Conference Record of the IEEE Photovoltaic Specialists Conference (1996) 25th 133-1136.

Dalal, V. et al., "Improvements in stability of a-silicon solar cells through the use of band gap grading" Conference Record of IEEE Photovoltaic Specialists Conference (1993), 23rd 806-20.

Suzuki et al, "Radio-frequency biased microwave plasma etching technique: A method to increase SiO2 etch rate", J Vac. Sci. Technol. B 3(4), 1025-1033, Jul./Aug. 1985.

* cited by examiner

METHOD AND APPARATUS FOR FORMING A FILM BY DEPOSITION FROM A PLASMA

CLAIM OF PRIORITY

This application is a U.S. national phase application under 35 U.S.C. §371 of International Patent Application No. PCT/EP2007/009303 filed Oct. 26, 2007, and claims the benefit of priority of EP Patent Application No. 06301115.9 filed Nov. 2, 2006. The International Application was published in English on May 8, 2008 as WO2008/052703.

This invention relates to a method for forming a film by deposition from a plasma on to a work surface. More particularly, it concerns the use of microwave energy to produce the plasma by electron cyclotron resonance. One area of particular interest is in depositing a film of amorphous silicon (a-Si:H) by dissociation of a silane, for example $SiH_4$, $Si_2H_6$ or a higher order of oligomer, in a process known as plasma-enhanced CVD (chemical vapor deposition). Other precursor gases which can be used to deposit amorphous silicon, or amorphous silicon alloys, include molecules in which silicon is present in combination with one or more of carbon, oxygen, or nitrogen, optionally together with hydrogen. An example of a silicon alloy is a structure of the type denoted by $SiO_xN_y$. Further, silicon-containing gases may be used together with other gases, for example germane, or gases not containing silicon may be used to deposit other films. One area of particular interest as regards the use of amorphous silicon films is in devices for converting solar energy into electrical power. Such amorphous silicon material can also find use in electronic applications such as TFT for display. As used herein, the term "amorphous silicon" denotes hydrogenated amorphous silicon, a-Si:H. For use in the areas just mentioned, some hydrogen must be present, typically 3-20%, to passivate the dangling bonds which are defects.

The invention is also believed to be applicable to the use of other precursor gases to deposit other materials in amorphous form, for example the use of germane to deposit a-Ge:H. It is further believed to be applicable to the deposition of microcrystalline materials such as µc-Si, µc-Ge and DLC (diamond-like carbon).

In the technical field of exciting a plasma to electron cyclotron resonance (hereinafter abbreviated to "ECR"), resonance is obtained when the frequency of gyration of an electron in a static or quasi-static magnetic field is equal to the frequency of the applied accelerating electric field. This resonance is obtained for a magnetic field B at an excitation frequency f which is related to B by the following relationship:

$$B = 2\pi m f/e \quad (1)$$

wherein m and e are the mass and the charge of an electron.

When exciting a plasma at electron cyclotron resonance frequency electrons revolve in phase with the electric field and continuously gain energy from the external excitation source where the ECR condition (1) is met such as to reach the threshold energy necessary for dissociating or ionizing the gas. To satisfy this condition, it is necessary firstly that the electron remains trapped in the magnetic field lines, i.e. that its radius of gyration is small enough with respect to the static magnetic field gradient for the electron to see a substantially constant magnetic field during its gyration, and secondly that the frequency of gyration remains large relative to the frequency of collision between electrons and neutral elements such as atoms and/or molecules. In other words, the best conditions for exciting a plasma to electron cyclotron resonance are expected to be obtained when simultaneously the gas pressure is relatively low and the excitation frequency f is high, which also means that the magnetic field intensity B must be high.

A major difficulty with conventional divergent ECR is that it is not possible to produce a plasma whose density is substantially uniform over a large area. This means that it cannot be used, for example, to deposit a substantially uniform layer of material on a work surface of large size. To overcome this problem, a technique has been developed which is known as distributed electron cyclotron resonance (DECR), which employs an apparatus in which a plurality of plasma excitation devices is formed into a network, with the devices collectively generating a plasma whose density is substantially uniform at the work surface. The individual plasma excitation devices are each constituted by a wire applicator of microwave energy, having one end connected to a source for producing microwave energy and having an opposite end fitted with at least one magnetic dipole for creating at least one surface having a magnetic field that is constant and of an intensity corresponding to electron cyclotron resonance. The dipole is mounted at the end of the microwave applicator in such a manner as to ensure that electrons accelerated to electron cyclotron resonance oscillate between the poles so as to create a plasma diffusion zone situated on the side of the dipole that is remote from the end of the applicator. The individual excitation devices are distributed relative to one another and in proximity with the work surface so as to create together a plasma that is uniform for the work surface.

Such a DECR apparatus is described in U.S. Pat. No. 6,407,359 (corresponding to EP-1075168), and more detailed discussion of the apparatus described therein is given below, with reference to drawings. As is apparent from those drawings, excitation devices, as viewed from the substrate, take the form of a generally rectangular array, by which we include also the particular case where the rectangle is a square, and such an apparatus is therefore sometimes referred to as matrix DECR (MDECR) apparatus. It is to be understood, however, that the present invention could also be applied to a DECR apparatus where the excitation devices were arranged in a non-rectangular two-dimensional network, for example in a hexagonal network or where there are two parallel lines of devices, with the devices in one line being offset with respect to one another. An example of a hexagonal array is given in "Determination of the EEDF by Langmuir probe diagnostic in a plasma excited at ECR above a multipolar magnetic field", T. Lagarde, Y. Arnal, A. Lacoste, J. Pelletier, Plasma Sources Sci. Technol. 10, 181-190, 2001. The devices could also be disposed as a circular, part-circular, or near-circular array. It should be noted that in some work done by the present inventors, depositions have been carried out with a central plasma excitation device being surrounded by three or six devices, the surrounding devices having the polarity of their magnets being oppositely disposed to the magnet of the central device and being arranged in a triangular or hexagonal array respectively.

Furthermore, the invention can be applied to a DECR apparatus which is not of an MDECR type. Thus, for example, it is applicable to a DECR reactor which, historically, preceded the MDECR type, and which has a cylindrical shape and uses long antennas and magnets that extend from the top to the bottom of the cylinder. Such arrangement is described in "Microwave Excited Plasmas" by Michel Moisan and Jacques Pelletier, Elsevier, 1992, and would be suitable for homogeneously coating a cylindrical substrate such as a tube or an object which is characterized by a dimension (length, radius) which is small as compared to the plasma ambipolar mean free path (See above reference, Appendix 9.1 page 269-271). This object can have a flat surface lying in the central part of the plasma and oriented perpendicular to the axis of the cylinder.

We have found that the quality of films deposited by a DECR process, and the deposition rate, can be improved by proper selection of location at which the film precursor gas is introduced and the direction in which the introduced gas is directed.

According to the present invention there is provided an apparatus for depositing a film on a substrate from a plasma, comprising an enclosure, a plurality of plasma generator elements disposed within the enclosure, and means, also within the enclosure, for supporting the substrate, each plasma generator element comprising a microwave antenna having an end from which microwaves are emitted, a magnet disposed in the region of the said antenna end and defining therewith an electron cyclotron resonance region in which a plasma can be generated by distributed electron cyclotron resonance (DECR), and a gas entry element having an outlet for a film precursor gas or a plasma gas, the outlet being arranged to direct gas towards a film deposition area which is situated beyond the magnet, as considered from the microwave antenna, the outlet being located above the ends of the magnets nearest the film deposition area, and thus being located in, or above, the hot electron confinement envelope, as defined herein.

The definition of "hot electron confinement envelope" required firstly a definition of "hot electron component zones". The hot electron confinement zones are those regions in which the hot (fast) primary electrons are trapped. These are regions in which the electrons oscillate between two adjacent magnet poles of opposite polarity, which could be two poles of a single magnet (hereinafter referred to as "intra-magnet poles") or poles of two adjacent magnets (hereinafter referred to as "inter-magnet poles"), in which the adiabatic approximation condition is met (Larmor radius is small with respect to the magnetic field gradient), and in which the electrons gain energy by crossing regions where the ECR coupling condition is met.

The magnets and the hot electron confinement zones define a hot electron confinement envelope. This is a volume which is the envelope of the array of magnets, expanded parallel to the magnetic axes of the magnets in both directions by the distance by which the inter-magnet zones (if any) extend beyond the ends of the magnets, and expanded perpendicular to the magnetic axes of the magnets in all directions by the distance by which the intra-magnet zones extend beyond the outward facing surfaces of the magnets.

In one preferred aspect of the invention, the gas outlet is located in a volume which consists of the envelope of the magnets expanded perpendicular to the magnetic axes of the magnets, but ignoring the distance by which the inter-magnet zones (if any) extend beyond the ends of the magnets nearest the substrate. This has the effect that the gas must flow past at least part of the array of magnets, after leaving the gas outlet. Still more preferably, the gas outlet is located in the envelope of the magnets, without taking into consideration either of the aforementioned expansions.

In another preferred aspect of the invention, the gas outlet is so located that the gas must flow past the entire length of a magnet. This will be the case, for example, when, according to one of the possibilities encompassed by the invention, the gas outlets are located above the hot electron confinement envelope, as opposed to being located in that envelope.

In a preferred aspect of the invention the gas outlet is so located that gas directed therefrom must, after it leaves the outlet, travel a distance of at least one mean free path before it leaves the hot electron confinement zone.

Further, in another preferred aspect of the invention, the gas outlet is so located that, before it leaves the hot electron confinement zone, gas directed from the gas outlet must, after it leaves the outlet, travels a distance equal to at least half the distance between the boundary of that zone furthest from the film deposition area to the boundary of that zone nearest to the film deposition area.

As used herein, it is to be understood that the reference to the outlet being arranged to direct gas towards a film deposition area covers not only the case where the gas is aimed directly at that area, but also any case where that area is wholly within an angle defined between a line extending from the outlet, in the direction of gas flow therefrom, and a line which is at right angles thereto and passes through the outlet. Under such circumstances the gas flow emerging from the outlet will have a vector component towards all portions of the said area.

It may be noted that although EP-1075168 shows, in FIG. 6 thereof, a plasma excitation device in which the gas entry outlet is located in the plasma region, the location is very close to the lower boundary of that region, so that the effects achieved by the present invention are not obtained there.

Figure 1:
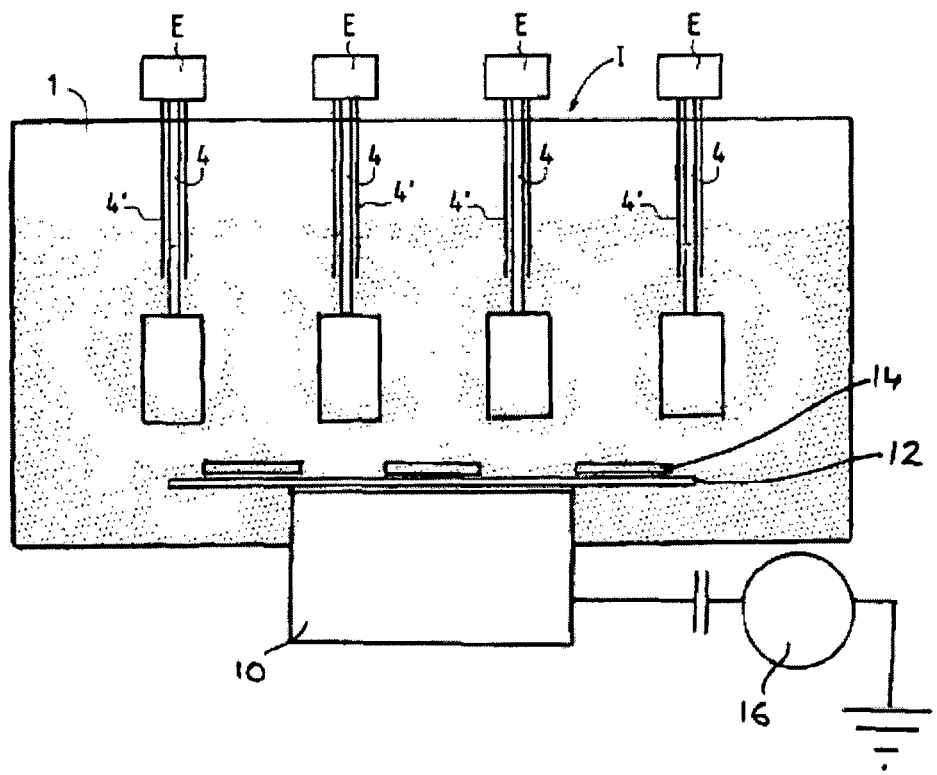
FIG. 1 is a diagrammatical elevation view showing a plasma production apparatus as described and shown in EP-1075168, omitting the means for introducing and extracting gas, which are shown separately in FIGS. 4a to 4d.
Figure 2:
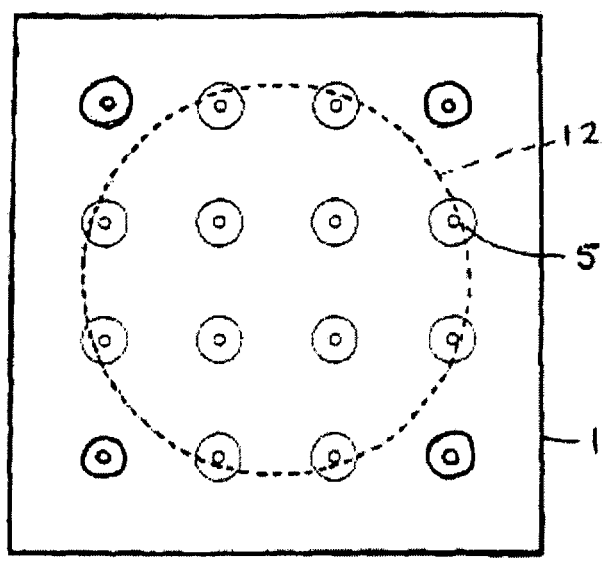
FIG. 2 is a plan view of the apparatus of FIG. 1.

FIGS. 1 and 2 show an apparatus for producing a plasma relative to a substrate on which a film is to be deposited. The apparatus comprises a sealed enclosure 1 represented diagrammatically and fitted with devices for admitting gas and for pumping gas out (not shown in FIG. 1), that enable the pressure of the gas that is to be ionized, or dissociated to be maintained at a desired value which, for example, can be about $10^{-2}$ to $2\times10^{-1}$ Pascals, depending on the nature of the gas and the excitation frequency. However, gas pressures less than $10^{-2}$ Pa (say down to $10^{-4}$ Pa, for example), or above $2\times10^{-1}$ Pa (say up to $5\times10^{-1}$ Pa, or even 1 Pa or more) can be used. For example, pumping can be carried out by a 1600 l/s Alcatel Turbo-molecular pump, which serves to extract gas from the enclosure.

Gas is admitted to the enclosure from an appropriate gas source, e.g. a cylinder of gas under pressure, under the control of a mass flow controller (MFC). The gas may, for example, comprise $SiH_4$ as a film precursor gas, or one of the other gases mentioned above in relation to the deposition of amorphous silicon. In addition to the film precursor there may also be introduced a non-reactive diluent gas, such as He, Ne or Ar, a reactive gas, such as hydrogen, nitrogen or oxygen, or a dopant gas such as diborane, trimethyl boron or phosphine. Typically any such other gases are introduced into the enclosure through the same port or ports as the film precursor gas, as a mixture therewith, but they could be introduced separately. The gas feeding system should ensure the appropriate flow of gases, which typically ranges from 1 to 1000 sccm (standard cubic centimetre per minute), into the reactor.

Figure 4A:
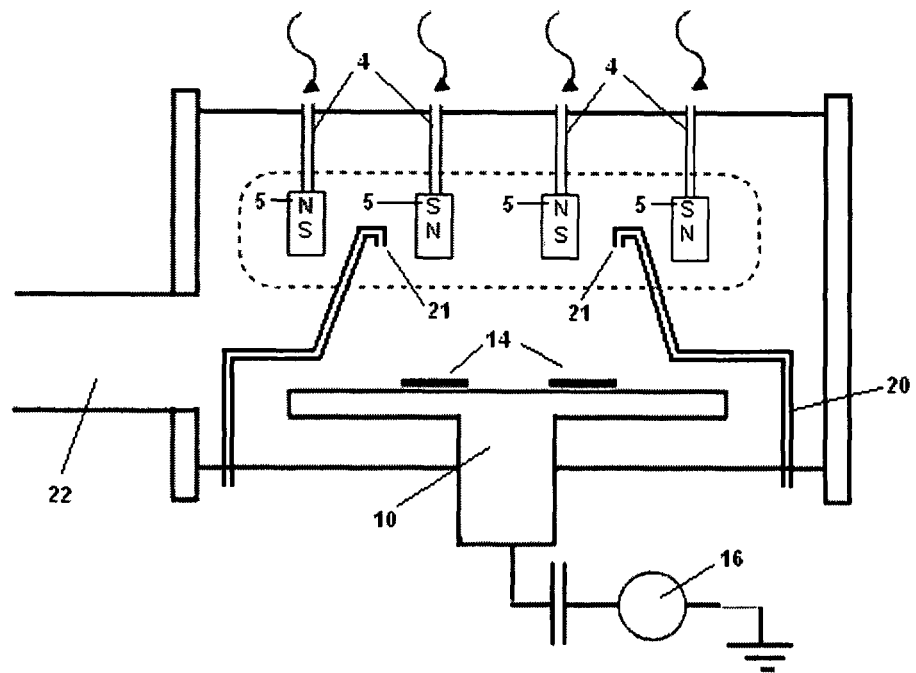
FIGS. 4a to 4d show four ways of introducing gas into the apparatus and extracting gas from the apparatus, of which the arrangements of any of FIGS. 4a to 4c can be used in the present invention, provided appropriate dimensions are chosen, and the arrangement of FIG. 4d is included for the purpose of comparison.
Figure 4B:
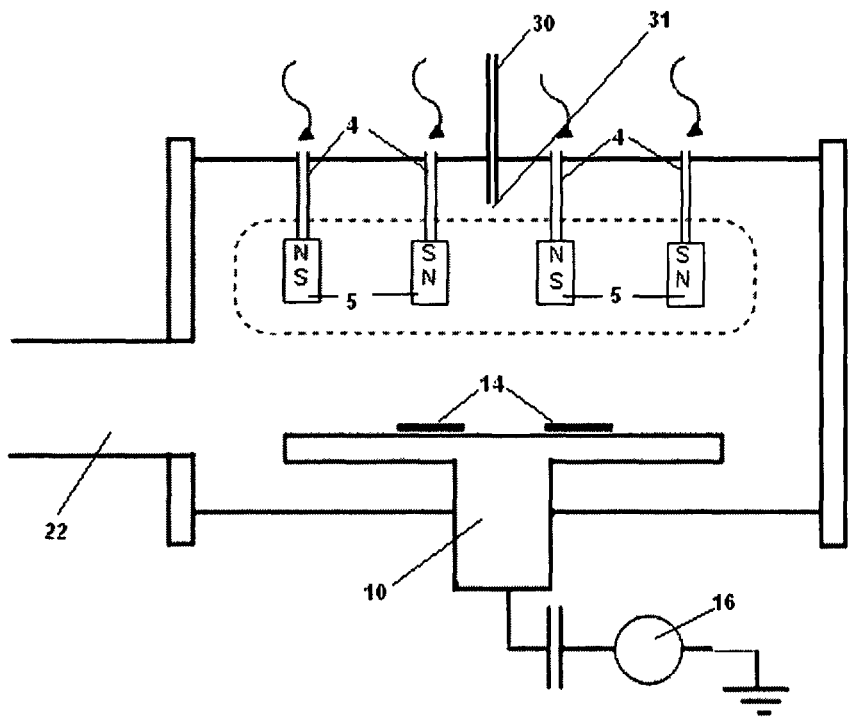
Figure 4C:
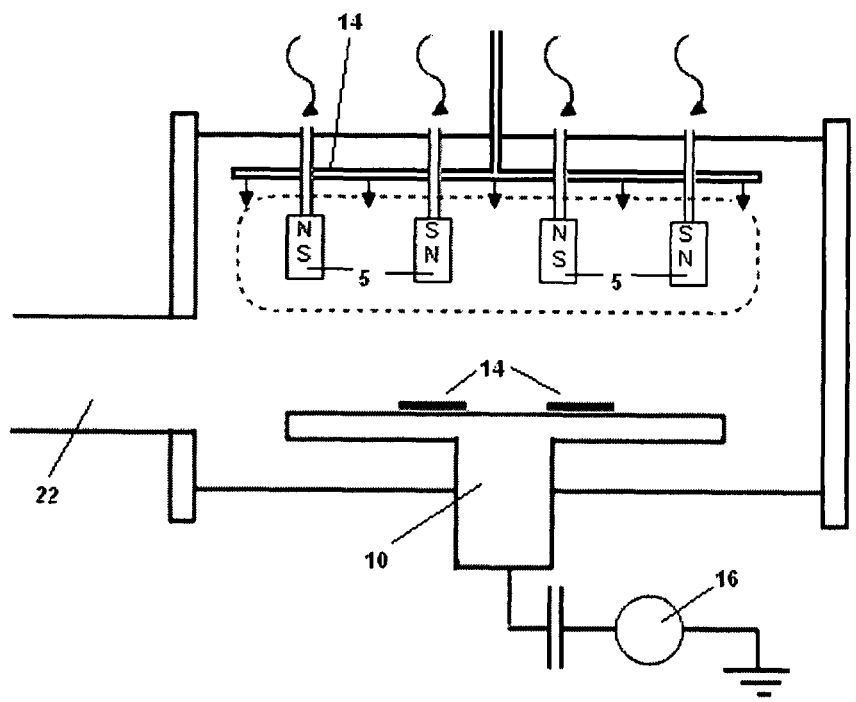
Figure 4D:
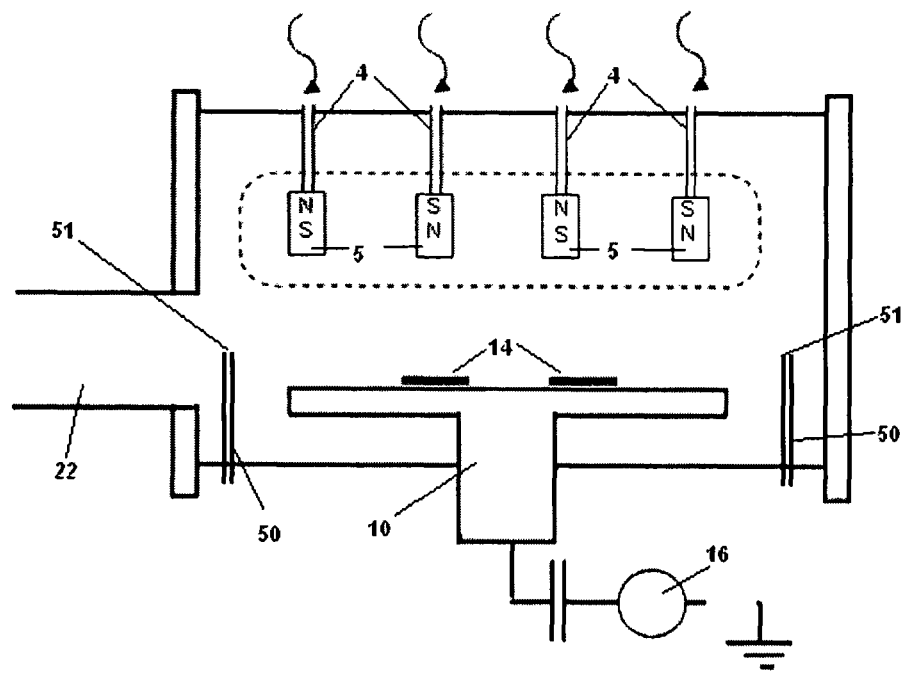

The injection port for the gas generally consists of a single tube, or a plurality of tubes, entering the deposition chamber. The tube, or each tube, if there is more than one, can be extended by a grid to ensure more even distribution of the gas inside the deposition chamber. Injection can be carried out anywhere in the reactor but it is preferred to direct the film precursor gas towards the substrate surface. One way of doing this, referred as "point" injection, is shown diagrammatically in FIG. 4a. In this arrangement the film precursor is introduced through a pipe, or a plurality of pipes 20 (two are shown), each of which has its outlet 21 located in the hot electron confinement envelope (shown by a broken line) and the substrate surface, and directed towards that surface. FIG. 4a also shows an exit 22 through which unreacted and dissociated gas is pumped out. Other features of FIG. 4a are described below with reference to the apparatus shown in FIG. 1. Other injection arrangements of particular interest are ones consisting of feeding the gas through a tube 30 having an outlet 31 (FIG. 4b) or a grid 40 (FIG. 4c) located "inside" the hot electron confinement envelope. In FIG. 4c the locations at which the gas leaves are shown by arrows, and it will be understood that the grid extends perpendicular to the plane of the paper, as well as laterally, so that there are injection points spread over the whole of the hot electron confinement envelope. By way of comparison another injection arrangement, which is not suitable for use in the present invention, and which is referred to as "volume" injection, is shown in FIG. 4d. Here the gas enters the deposition chamber at a location, or a plurality of locations (two are shown) spaced significantly from both the substrates and the hot electron confinement envelope, and in a direction away from the substrates. FIG. 4d shows this being done via pipes 50 having outlets 51.

The plasma chamber is equipped with a substrate holder 10, which is shown as a fixed part of the apparatus. One function of the substrate holder is to heat the substrates to the required deposition temperature. This is typically between room temperature and 600° C., and in the case of the deposition of amorphous silicon is preferably in excess of 200° C., more preferably between 225° C. and 350° C. The temperature being referred to here is the actual substrate temperature, as opposed to the nominal substrate temperature which may be measured by measuring the temperature of the substrate holder. The significance of the distinction is discussed further in our co-pending application filed on the same date as the present application and entitled "Method for forming a film of amorphous silicon by deposition from a plasma" (our reference G27558EP (European Patent Application No. 06301114.2)) mentioned above.

A carrier plate 12, having thereon at least one substrate 14, and optionally a plurality of such substrates, is removably mounted on the holder 10, so that it can be brought into the chamber with substrates to be coated, and removed from the chamber with the substrates after they have been coated. However, alternatively the substrate can be glued directly on the substrate holder, using a thermally conductive glue. This improves thermal contact between the substrate and the substrate holder, which is otherwise difficult to achieve under low pressure conditions. This is discussed further in our co-pending application filed on the same date as the present application and entitled "Method for forming a film of amorphous silicon by deposition from a plasma" (our reference G27558EP (European Patent Application No. 06301114.2)). In this case the holder, with its substrates, needs to be introduced into the enclosure prior to the deposition process, and removed from it afterwards. If gluing is not used, one way to try to improve the heating of the substrate is to precede the low pressure film deposition step by a step in which the enclosure is filled with gas at a relatively high pressure (typically around 100-200 Pa). The high pressure gas provides thermal transfer across whatever gap may exist between the substrate and the heated holder, ensuring initial heating of the substrates. Another possibility is to place a thermally conductive carbon film between the substrate and the substrate holder. The substrate holder can be heated by circulating a hot fluid inside it, but heating could alternatively be achieved by electrical heating resistors embedded in the substrate holder. Alternatively, however, it is possible to heat the substrates directly, for example by using infrared lamps.

Another function of the substrate holder is to allow polarization of the substrate surface such as to control the energy of ions towards the substrate. Polarization can be achieved using either a source of RF voltage or using a DC voltage and requires the substrate holder to be electrically insulated from ground. Polarization is achieved by connecting the electrically insulated substrate holder to an appropriate RF or DC generator 16 with an adequate matching circuit in the case of RF polarization. When depositing on an insulating substrate, or on an insulating layer previously deposited on a substrate (which may or may not be insulating), the use of an RF generator is preferred. When depositing on a conductive substrate or on a conductive layer previously deposited on a substrate which may or may not be conductive, the bias can be applied by either an RF or DC generator with suitable electrical connection to the substrate surface. In a specific embodiment an RF-bias was applied using a 13.56 MHz Dressler generator connected to the substrate holder via an automatic tuning box. Even when using an RF generator, the resulting bias on the substrate surface comprises a DC bias component, as a result of conditions in the plasma. An explanation of how this occurs can be found, in the content of the description of a completely different plasma process, in Suzuki et al, "Radio-frequency biased microwave plasma etching technique: A method to increase $SiO_2$ etch rate", J. Vac. Sci. Technol. B 3(4), 1025-1033, July/August 1985.

The plasma production apparatus I has a series of individual plasma excitation devices E spaced apart from one another and located in the proximity of the substrates, so as to operate together to create a plasma that is uniform for the substrates. Each individual plasma excitation device E comprises an elongate microwave energy applicator 4. Each applicator 4 has one of its ends connected to a respective microwave energy source, which lies outside the enclosure 1. Alternatively, however, a single microwave energy source can feed microwaves to all the applicators 4, or there can be a plurality of energy sources fewer in number than the number of applicators. For example, an array of sixteen applicators can conveniently be fed by two 2.45 GHz microwave generators, each of 2 kW maximum power, and each feeding eight applicators via a power splitter and respective slug tuners. Each applicator 4 is advantageously in the form of a tube surrounded by a coaxial tube 4', thus enabling microwave energy to propagate to the free end thereof while avoiding radiating microwaves, and reducing microwave coupling between the applicators. In order to ensure proper transfer of the microwave energy into the plasma, each applicator is preferably equipped with a matching device that minimizes, or at least reduces, the reflected power.

Each microwave applicator 4 has its free end connected to at least one permanent magnet 5. Each magnet (preferably) has its magnetic axis parallel to the long axis of the magnet itself. In one particular form of this arrangement all the plasma excitation devices have their magnets oriented in the same direction (a monopolar configuration). i.e. all their north poles are at the top and all their south poles are at the bottom, or vice versa. In another, some of each pole are at the top and some of each pole are at the bottom (a multipolar configuration). An example of the latter is an array, where, viewed from one end as in FIG. 2, and passing along any given row or column of devices, one successively encounters poles of alternate polarity. Yet another example is where all the magnets in a given row (or column) have the same polarity, but the columns (or rows) are of alternative polarity. However, arrangements can also be used where the magnetic axes of the magnets are not parallel to the long axes of the magnets themselves, provided there are significant regions where the lines of the magnetic field are parallel to the propagation vector of microwaves. This is necessary in order to ensure the existence of significant regions where ECR damping can occur.

Figure 7A:
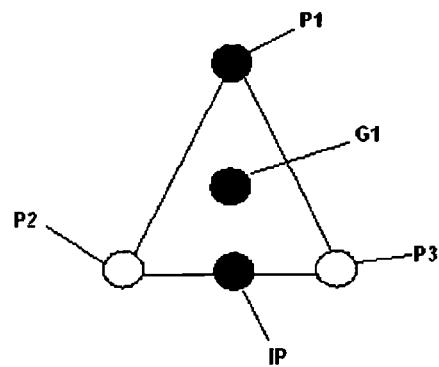
FIGS. 7a and 7b show diagrammatically the arrangement of magnets and gas injector in a particular reactor having four plasma generators.
Figure 7B:
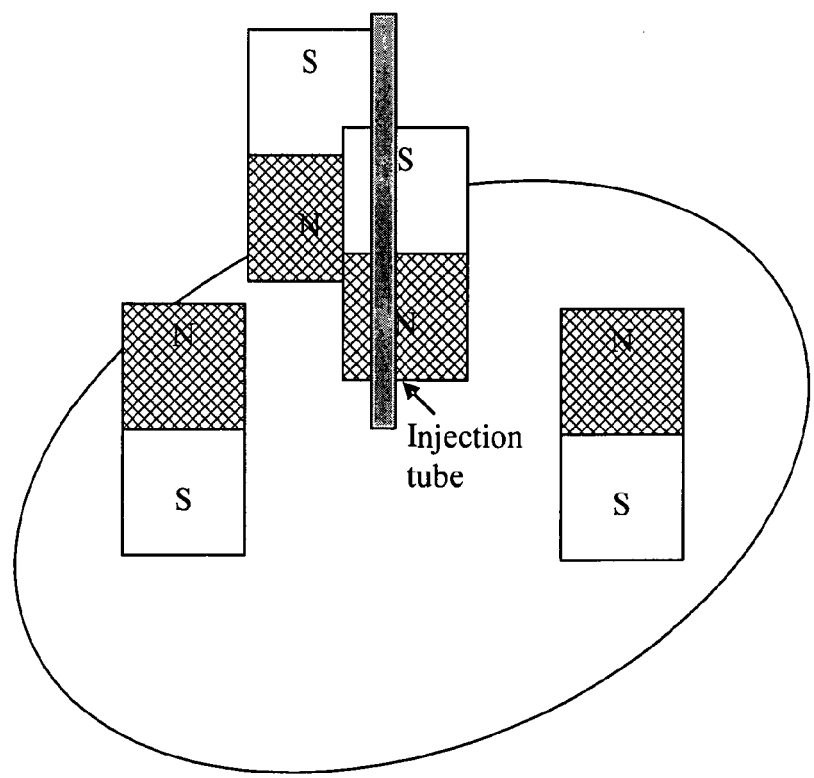

As mentioned above, FIGS. 7a and 7b show the hot electron confinement envelope for two particular magnet configurations. In each figure the envelope is indicated by the parallelepiped box drawn in bold lines. FIG. 7a shows the case of a wholly multipolar configuration, in which every magnet is oppositely disposed to each of its intermediate neighbours. FIG. 7b shows the case of a homopolar configuration, in which all magnets are identically orientated. Appropriate envelopes can be constructed for other magnet configurations, for example ones in which all the magnets in a given row have the same orientation, but adjacent rows are of opposite orientation to one another.

Figure 3:
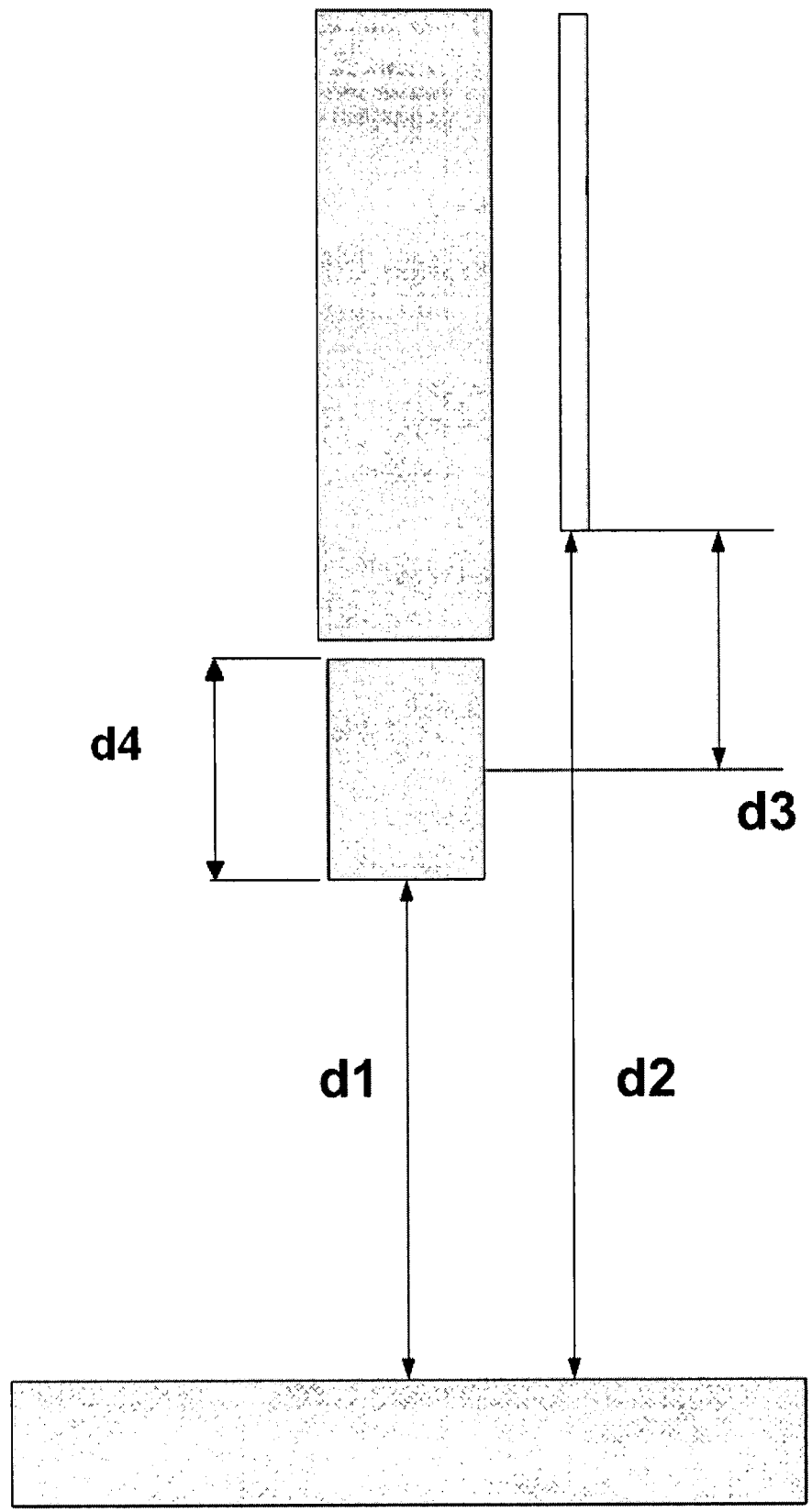
FIG. 3 shows the dimensional relationship between an antenna of the plasma generator, a magnet of the plasma generator, a gas injection tube and a substrate holder.

FIG. 3 shows diagrammatically one of the antennas of FIG. 1, and its corresponding magnet, together with the substrate holder, and shows the dimensions of these components as they were in the test apparatus used to derive the results given below. It is to be understood that the dimensions used in an apparatus according to the present invention can vary greatly, and are by no means restricted to what are shown. The significance of the illustrated dimensions to the results derived will be apparent from what is said below.

FIGS. 5a to 5d are graphs showing how various material properties of the film vary with the location at which the film precursor gas is injected into the reactor, for point, tube and grid injection, all of which involve injecting film precursor gas (SiH$_4$) towards the substrate at a flow rate of 100 sccm (standard cubic centimetres per minute). In these graphs the properties are plotted against the distance between the outlet of injection pipe and the substrate, though, as will be explained further below, what appears to be more significant is the location of the outlet of the injection pipe with respect to the hot electron confinement envelope.

Materials have namely been characterized by spectroscopic techniques. Spectroscopic ellipsometry is a technique that measures the dispersion function of the material, and can be used to determine material properties such as the film thickness, the material bandgap and the disorder parameter. The pseudo-dielectric function $\epsilon_i$ of the film (the imaginary part of the dielectric function) is also obtained from this fit. The maximum value of this function, $\epsilon_i(max)$, correlates with the refractive index of the material at 2 eV, and this in turn is a good measure of the film density. A method of carrying out measurements by spectroscopic ellipsometry is described in A. Fontcuberta i Morral, P. Roca i Cabarrocas, C. Clerc, "Structure and hydrogen content of polymorphous silicon thin films studied by spectroscopic ellipsometry and nuclear measurements". PHYSICAL REVIEW B 69, 125307/1-10, 2004.

Figure 5A:
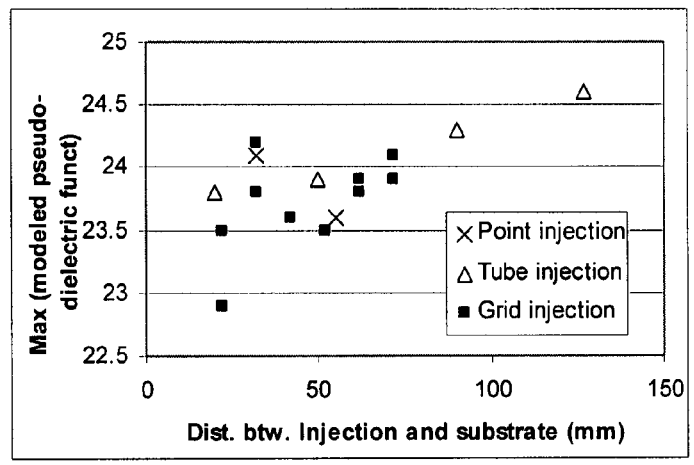
FIGS. 5a to 5d are graphs in which various film properties are plotted against the distance between where the gas is introduced and the substrate.

FIG. 5a shows that the density of the film increases when the injection point is located further away from the substrate and thus nearer to, or in, the high density plasma region. By way of comparison, the value of $\epsilon_i(max)$ measured for films deposited with volume injection, which involves injecting away from the substrate, was between 20.8 and 21.7.

Figure 5B:
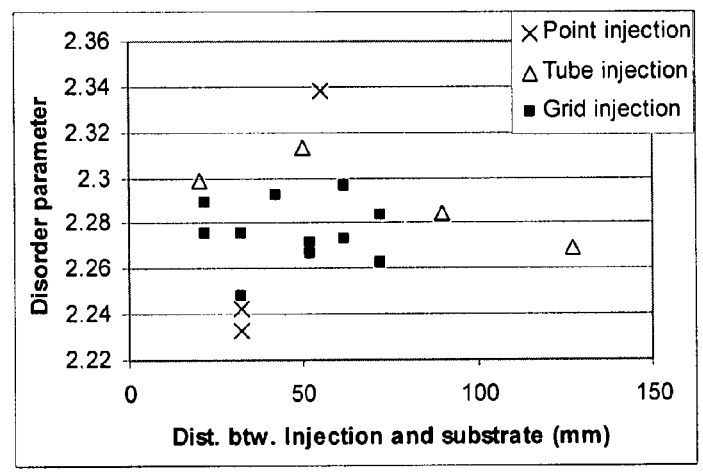
Figure 5C:
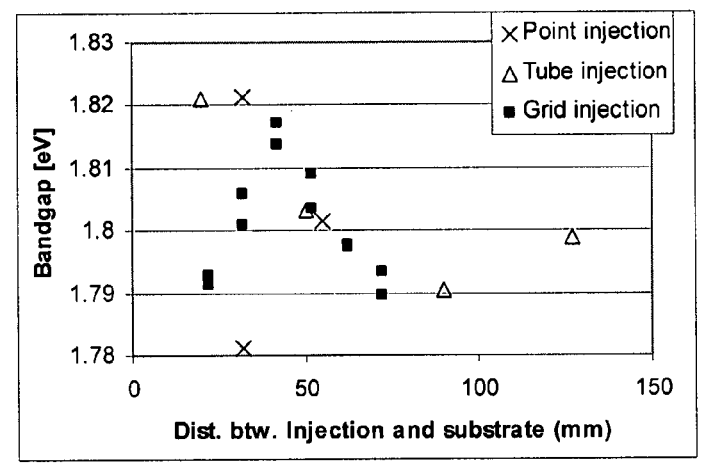
Figure 5D:
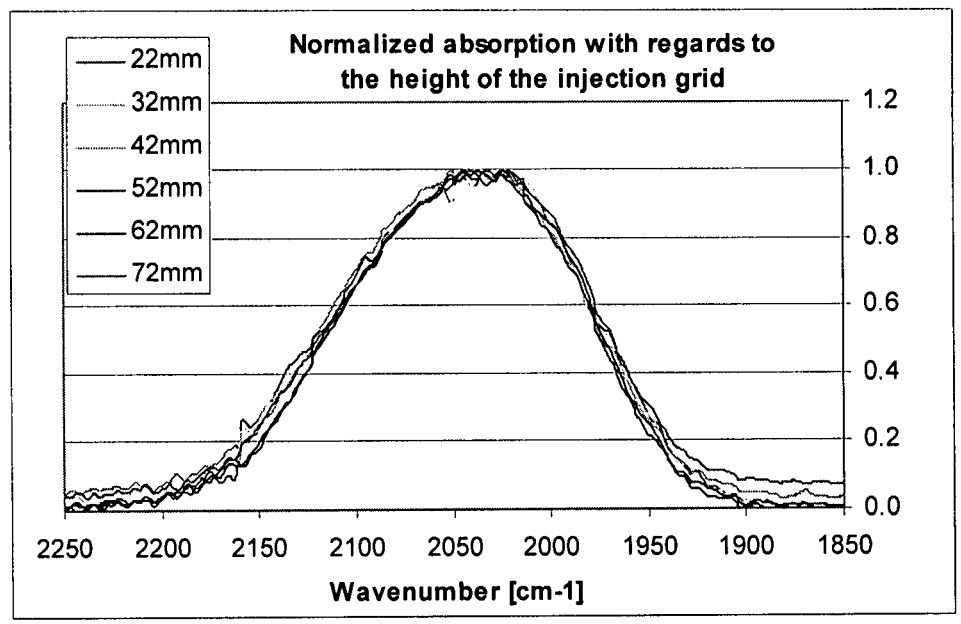

The disorder parameter does not show any significant variation with the position of the injection system (the variations observed in FIG. 5b are due to the noise). By way of comparison, the disorder parameter is 2.16 for the films deposited with volume injection.

Similarly, the material bandgap does not vary much with the position of the injection system but presents a maximum when approaching the injection outlet from the substrate. However, all of the bandgap values measured for point, tube and grid injection, at whatever position, were lower, i.e. better, than the comparison of values of (1.89 to 1.96 eV) measured for the films deposited by volume injection.

FTIR (Fourier Transformed Infrared) absorption allows the determination of the nature of the hydrogen bonding in the film. Absorption peaks at 2000 and 2090 cm$^{-1}$ are respectively characteristic of SiH and SiH$_{x(x>1)}$ bonds. The second are known to be responsible for the degradation of a-Si:H (namely the Staebler Wronsky effect). From FIG. 5d it can be seen that FTIR spectra of the films deposited with the injection grid at different heights are similar. The position of the grid then has no influence on the nature of the films. The same is expected to be true as regards point and tube injection.

To summarise with regard to the data given in FIGS. 5a to 5d, the density of the film material, as reflected by the value $\epsilon_i(max)$, is increased, and thus improved, by increasing the distance between the substrate and the gas injection point, while the disorder parameter, material bandgap and normalised absorption are substantially unaffected by it.

Figure 6:
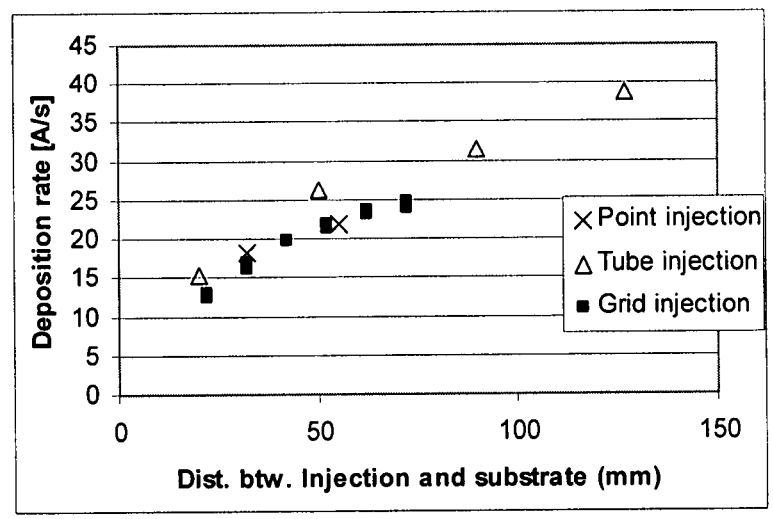
FIG. 6 is a graph in which film deposition rate is plotted against that distance.

While the material properties, apart from the density, do not vary much with the height of the injection system, the deposition rate increases greatly when the injection point is located further from the substrate. FIG. 6 relates to a set up in which, using the notation of FIG. 3, d1 was 100 mm, d4 was 32 mm, and the gap between the lower end of the antenna and the upper end of the magnet was 3 mm. The magnetic field was 1200 Gauss at the magnet surface. FIG. 6 is a plot of deposition rate versus the distance d2 between the injection point and the upper surface of the substrate. It can be seen from FIG. 6 that the deposition rate increases from 14 to 38 Å/s as d2 increases from 20 to 127 mm. Considering the dimensions mentioned above, one can see that at the larger values of d2 the film precursor gas is injected directly between the antennas, and thus in the hot electron confinement envelope, or slightly above it. The hot electrons trapped in the zone are very efficient in dissociating the precursor gas that is injected through this zone towards the substrate, and the direction of the injection also creates a flow of activated species from the high density plasma region towards the substrate. This observation suggests that what may be critical is not so much a large value for d2, but the location of the injection point with respect to the hot electron confinement envelope. This is discussed further below. By way of comparison, the deposition rates for films deposited by volume injection were found to be from 15 to 21 Å/s.

Some additional deposition trials were carried out to determine the relative importance of the distances d1 and d2. These data are presented in the section below.

These trials were carried out in a reactor which had only 4 plasma generators (see FIGS. 7a and 7b). Viewed from the top, the central plasma generator G1 and one of the peripheral generators P1, had a SN polarity (North facing down). The other two peripheral antennas P1 and P3 had a NS polarity (South facing down). The black dot IP represents the location of the precursor gas injection point (FIG. 7a).

Both the distance d1 between the bottom of the magnets and the substrate holder as well as the distance d2 between the injection point and the substrate holder were changed, and hence the distance d3 between the injection point and the middle of the high density plasma volume (taken as the horizontal plane passing through the centre of the magnet).

For these trials, the constant deposition conditions were as follows:
silane flow rate 85 sccm
bias −60V
power supplied at each antenna 125W
substrate glued with Ag-glue directly on the carrier plate as described in our copending application filed on the same date as the present application and entitled "Method for forming a film of amorphous silicon by deposition from a plasma" (our reference G27558EP (European Patent Application No. 06301114.2))
substrate temperature 235-240° C.
The different distances tested were:
d1: 10 cm with
    d2=8.2, 12.2 and 16 cm corresponding to injection 3.6 cm below, 0 cm and 4.3 cm above the middle of the high density plasma volume
d1: 14 cm with
    d2=12.2, 16 and 19.6 cm corresponding to injection 3.6 cm below, 0 cm and 3.9 cm above the middle of the high density plasma volume.

Because for each value of d1, depositions were done by injecting at similar distances above, in and below the centre of the hot electron confinement envelope, an analysis could be carried out by looking at the effect of d1 and d3 on the material properties.

The most influential parameters are presented in the table below, where it can be seen that the parameter of primary importance is not always the same, and that d1 and d3 do not always both influence a given parameter.

| Characteristics | Primary influence | Secondary influence |
|---|---|---|
| Deposition rate | d1 | d3 |
| Surface roughness | d1 | |
| Bandgap | d3 | |
| Disorder parameter (C) | d1 | |
| Imaginary part of the dielectric function $\epsilon_i$ (max) | d1 | |

Figure 8A:
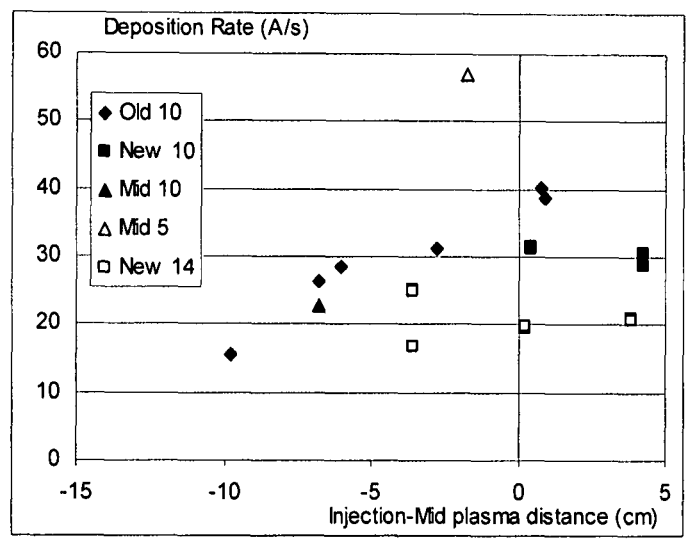
FIGS. 8a to 8e are graphs showing the effect of injection-mid plasma distance on various parameters.

The data used to generate FIG. 6 is combined with the data on deposition rate from the experiment just described, and is set out graphically in FIG. 8a. In this figure the effect of the injection-mid plasma distance d3 on deposition rate is clearly visible.

Figure 8B:
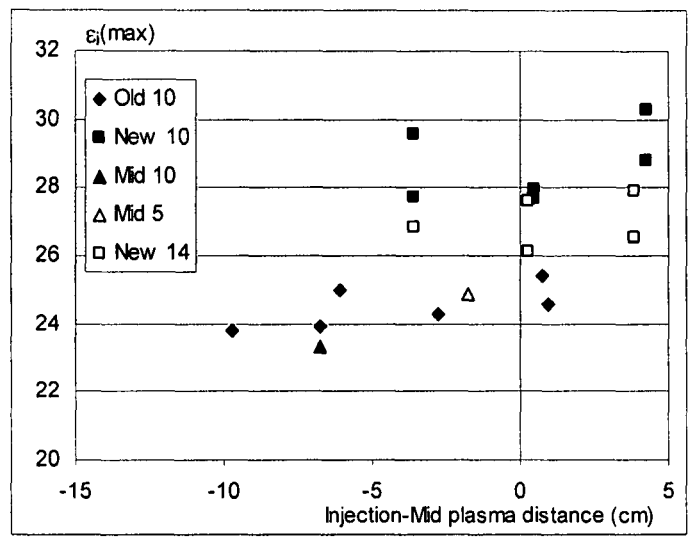
Figure 8C:
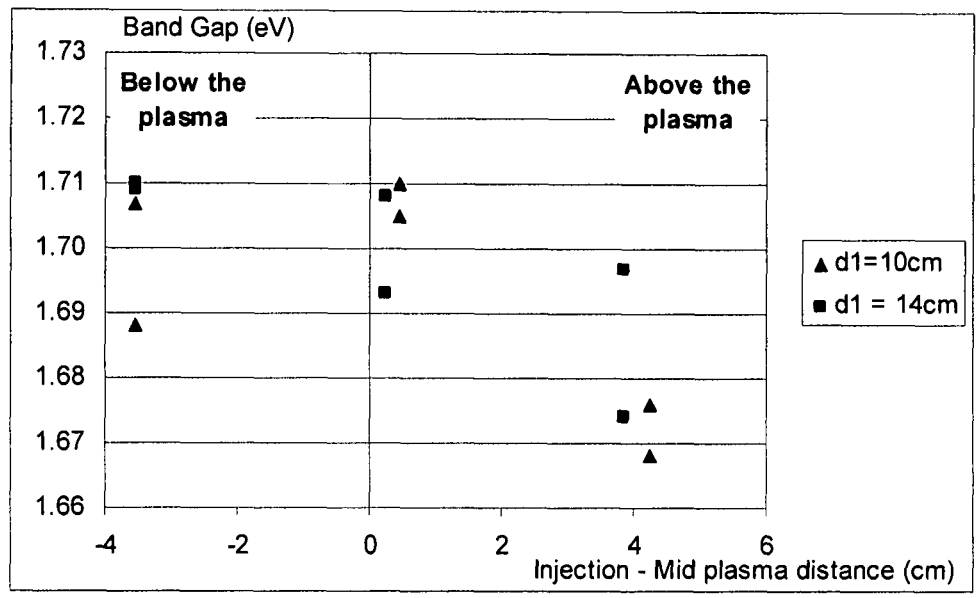
Figure 8D:
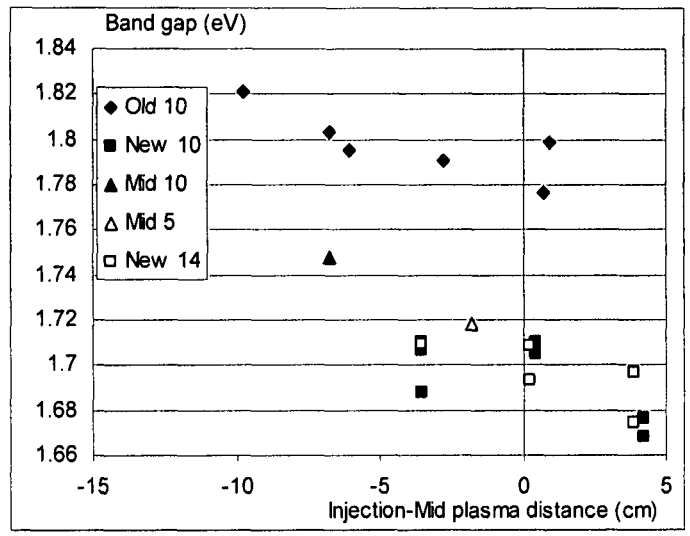

FIG. 8b shows the effect of the distance d3 on $\epsilon_i$(max), and shows that this improves (increases) as one goes from a large negative value, through zero, to a positive value. When it comes to the material band gap, the data from the above table shows that the distance d3 has a large effect as can be seen from FIG. 8c. This shows that it is preferable to inject above the plasma as this leads to a material with a smaller bandgap. Combining the data on bandgap from the table with the data from FIG. 5c, (see FIG. 8d) the effect of the distance d3 is quite clearly seen.

Clearly the trend is that better material bandgap is achieved by injecting at least in the high density plasma area and even above it (and hence further away from the substrate).

The minority carrier diffusion length Ld for the samples which are the subject of the above table is plotted against d3

| Sample | d1 cm | d2 cm | d3 cm | Injection versus plasma | RF power density mW/cm2 | Plasma Pressure mTorr | Rate Å/s | Roughness A | Band gap eV | C | Epsi (i) mod | Ld nm |
|---|---|---|---|---|---|---|---|---|---|---|---|---|
| d110706-1-1 | 10 | 16 | 4.3 | Above | 182 | 5.1 | 31 | 29 | 1.668 | 2.06 | 30.29 | 130 |
| d110706-1-2 | 10 | 16 | 4.3 | Above | 182 | 5.1 | 29 | 31 | 1.676 | 2.12 | 28.78 | |
| d120706-1-1 | 10 | 12.2 | 0.4 | In | 188 | 4.93 | 32 | 25 | 1.705 | 2.17 | 27.96 | 115 |
| d120706-1-2 | 10 | 12.2 | 0.4 | In | 188 | 4.93 | 31 | 28 | 1.710 | 2.18 | 27.68 | |
| d130706-1-1 | 10 | 8.2 | −3.6 | Below | 164 | 4.74 | 25 | 36 | 1.688 | 2.04 | 29.57 | 115 |
| d130706-1-2 | 10 | 8.2 | −3.6 | Below | 164 | 4.74 | 25 | 27 | 1.707 | 2.17 | 27.7 | |
| d160706-1-1 | 14 | 12.2 | −3.6 | Below | 151 | 4.67 | 17 | 22 | 1.710 | 2.23 | 26.86 | 120 |
| d160706-1-2 | 14 | 12.2 | −3.6 | Below | 151 | 4.67 | 17 | 22 | 1.709 | 2.23 | 26.83 | |
| d170706-1-1 | 14 | 16 | 0.3 | In | 157 | 4.66 | 20 | 24 | 1.693 | 2.19 | 27.6 | 115 |
| d170706-1-2 | 14 | 16 | 0.3 | In | 157 | 4.66 | 20 | 27 | 1.708 | 2.28 | 26.12 | |
| d170706-2-1 | 14 | 19.6 | 3.9 | Above | 157 | 4.99 | 21 | 25 | −1.674 | 2.22 | 27.92 | 120 |
| d170706-2-2 | 14 | 19.6 | 3.9 | Above | 157 | 4.99 | 21 | 29 | 1.697 | 2.29 | 26.54 | |

It is to be noted that the value of d3 is equal to 0 when the injection is done precisely in the middle of the hot electron confinement envelope (middle of the magnet). It will take a negative value if the injection is carried out below the hot electron confinement envelope and a positive value of the injection is carried out above it.

Figure 8E:
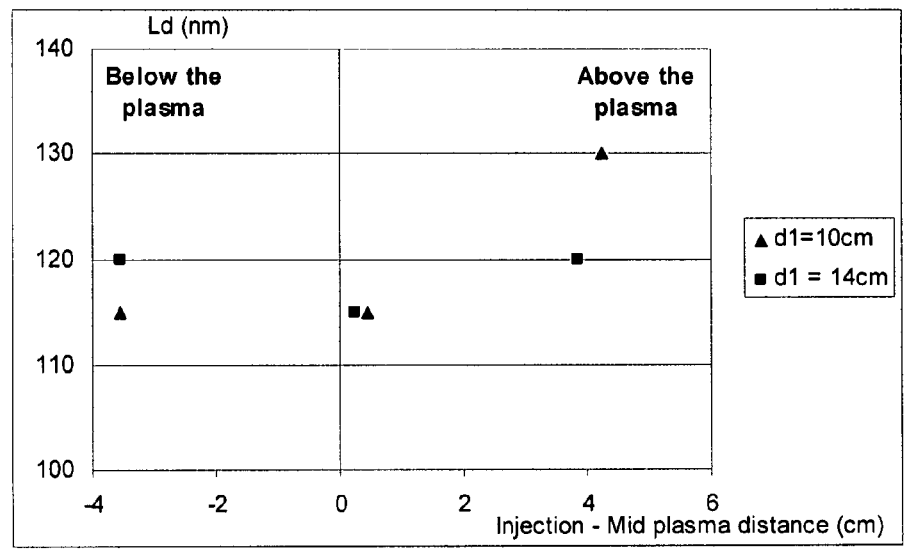
Figure 9A:
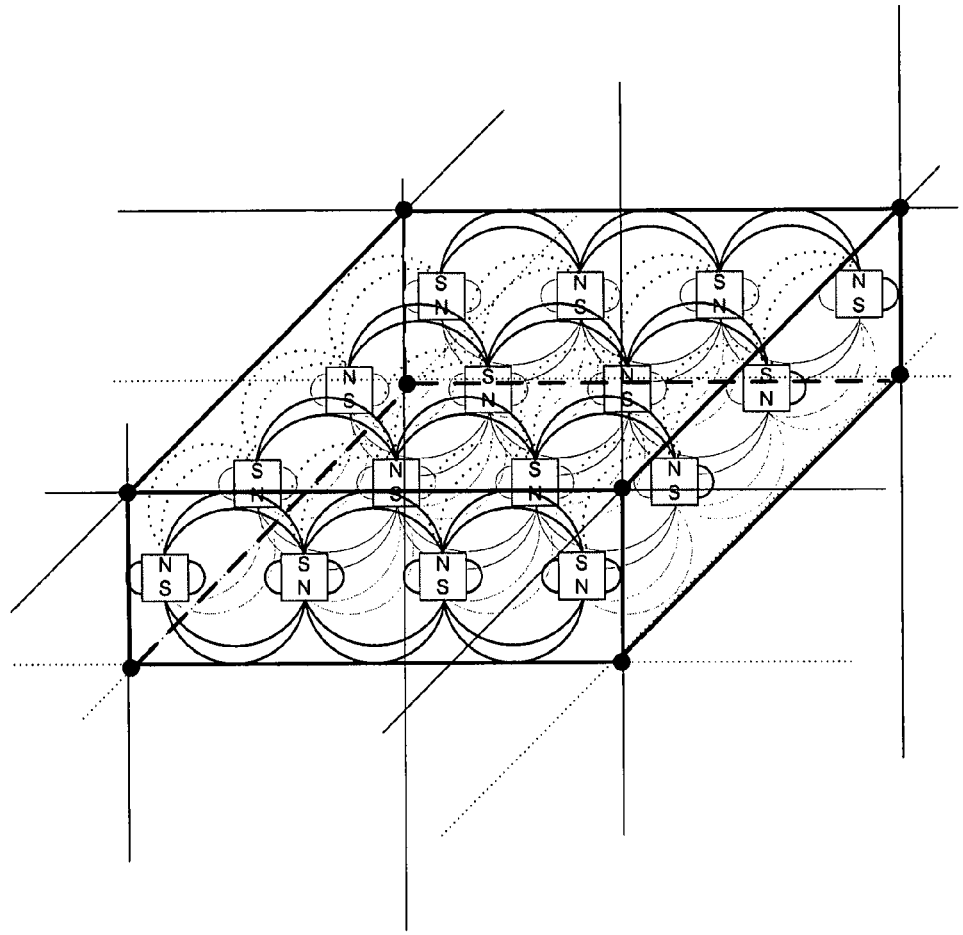
FIGS. 9a and 9b show the hot electron confinement envelope for two possible magnet configurations.
Figure 9B:
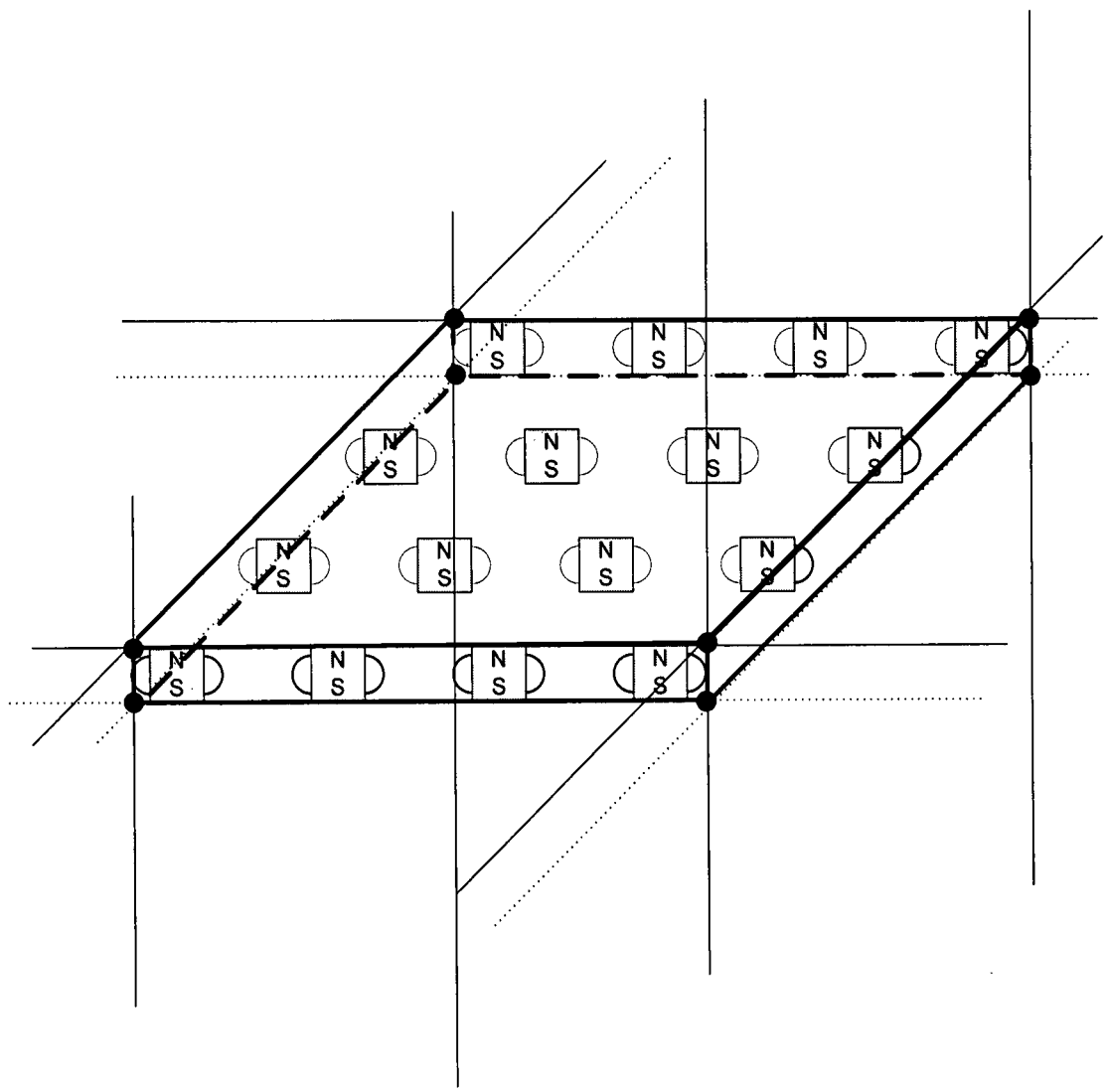

Two glass samples were coated during each deposition. Sample 1 (identified by a 1 in the table above by the last digit of the sample reference number) lay directly below the injection tube, while the second sample (sample 2) was not directly under the tube.

in FIG. 8e. This shows that Ld is influenced by the distance d3, and that there is a trend for the diffusion length to increase (improve) by injecting in the high plasma density region or even above it.

In summary, to achieve a high deposition rate of a high quality material, the film precursor gas injection should be carried out toward the substrate with a short antenna-substrate distance d1 and a large injection substrate distance (and hence injection-mid plasma distance d3) such that gas injection occurs at least in the hot electron confinement envelope and preferably above it.

The invention claimed is:

1. An apparatus for depositing a film on a substrate from a plasma comprising:
   an enclosure,
   a plurality of plasma generator elements disposed within the enclosure, and means, also within the enclosure, for supporting the substrate,
   each plasma generator element comprising:
      a microwave antenna having an end from which microwaves are emitted,
      a magnet disposed in the region of the said antenna end and defining therewith an electron cyclotron resonance region in which a plasma can be generated by distributed electron cyclotron resonance (DECR), and
      at least one gas entry element having an outlet for a film precursor gas or a plasma gas, the outlet being arranged to direct gas towards (as defined herein) a film deposition area which is situated beyond the magnet, as considered from the microwave antenna, the outlet being located above the ends of the magnets nearest the film deposition area, and thus being located in, or above, the hot electron confinement envelope, as defined herein.

2. The apparatus according to claim 1, wherein said generator elements are arranged to form a two-dimensional network.

3. The apparatus according to claim 2, wherein the said generator elements are arranged in a rectangular or square array.

4. The apparatus according to claim 1, wherein a plurality of gas entry elements are present.

5. The apparatus according to claim 1, wherein the gas entry element comprises a grid having a plurality of outlets and means for receiving the gas and feeding it to the outlets.

6. The apparatus according to claim 1, wherein the gas outlet is located in a volume which consists of the envelope of the magnets expanded perpendicular to the magnetic axes of the magnets, but ignoring the distance by which the intermagnet zones (if any) extend beyond the ends of the magnets nearest the substrate.

7. The apparatus according to claim 1, wherein the gas outlet is located in the envelope of the magnets.

8. The apparatus according to claim 1, wherein the gas outlet is so located that gas must flow past the entire length of a magnet after leaving the gas outlet.

9. The apparatus according to claim 1, wherein the gas outlet is so located that gas directed therefrom must, after it leaves the outlet, travel a distance of at least one mean free path before it leaves the hot electron confinement zone.

10. The apparatus according to claim 1, wherein the gas outlet is so located that, before it leaves the hot electron confinement zone, gas directed from the gas outlet must, after it leaves said outlet, travel a distance equal to at least half the distance between the boundary of that zone furthest from the film deposition area to the boundary of that zone nearest the film deposition area.

11. A method of depositing a film on a substrate from a plasma, using an apparatus according to claim 1, wherein the film precursor gas is a silicon precursor.

12. The method according to claim 11, wherein the film formed is of amorphous silicon.

13. An apparatus for depositing a film on a substrate from a plasma comprising:
   an enclosure,
   a plurality of plasma generator elements disposed within the enclosure, and means, also within the enclosure, for supporting the substrate,
   each plasma generator element comprising:
      a microwave antenna having an end from which microwaves are emitted,
      a magnet disposed in the region of the said antenna end and defining therewith an electron cyclotron resonance region in which a plasma can be generated by distributed electron cyclotron resonance (DECR), and
      at least one gas entry element having an outlet for a film precursor gas or a plasma gas, the outlet being arranged to direct gas towards (as defined herein) a film deposition area which is situated beyond the magnet, as considered from the microwave antenna, the outlet being located above the ends of the magnets nearest the film deposition area, and thus being located above the hot electron confinement envelope, as defined herein.

* * * * *